United States Patent
Toulouse et al.

(10) Patent No.: US 12,346,178 B2
(45) Date of Patent: Jul. 1, 2025

(54) SYSTEM AND METHOD FOR ADJUSTING ENVIRONMENTAL CONDITIONS

(71) Applicant: Dell Products L.P., Round Rock, TX (US)

(72) Inventors: Michael Mitsuo Toulouse, San Jose, CA (US); Tyler Baxter Duncan, Austin, TX (US); Benjamin David Behrendt, Round Rock, TX (US)

(73) Assignee: DELL PRODUCTS L.P., Round Rock, TX (US)

( * ) Notice: Subject to any disclaimer, the term of this patent is extended or adjusted under 35 U.S.C. 154(b) by 320 days.

(21) Appl. No.: 17/971,154

(22) Filed: Oct. 21, 2022

(65) Prior Publication Data
US 2024/0134429 A1 Apr. 25, 2024
US 2024/0231451 A9 Jul. 11, 2024

(51) Int. Cl.
*G06F 1/20* (2006.01)
*H05K 7/20* (2006.01)

(52) U.S. Cl.
CPC ......... *G06F 1/206* (2013.01); *H05K 7/20354* (2013.01)

(58) Field of Classification Search
CPC ...................................... G06F 1/206
See application file for complete search history.

(56) References Cited

U.S. PATENT DOCUMENTS

| | | | |
|---|---|---|---|
| 10,231,358 B1* | 3/2019 | Gillooly | H05K 7/20381 |
| 11,707,706 B1* | 7/2023 | Bhate | F24F 8/10 95/273 |
| 2012/0118553 A1* | 5/2012 | Chang | F24F 11/76 165/278 |
| 2016/0273849 A1* | 9/2016 | Ohkubo | F28F 13/04 |
| 2019/0275864 A1* | 9/2019 | Hsieh | G06F 1/1656 |

FOREIGN PATENT DOCUMENTS

WO WO-2009082401 A1 * 7/2009 ............. G05D 22/02

* cited by examiner

Primary Examiner — Suresh Suryawanshi
(74) Attorney, Agent, or Firm — Chamberlain, Hrdlicka, White, Williams & Aughtry; Aly Z. Dossa

(57) ABSTRACT

A method for removing moisture from an airflow via a cooling system includes identifying a plurality of active cooling circuits in the cooling system. The method also includes lowering a first temperature set point of a first cooling circuit of the multiple cooling circuits. In addition, the method includes raising a second temperature set point of a second cooling circuit of the multiple cooling circuits.

17 Claims, 5 Drawing Sheets

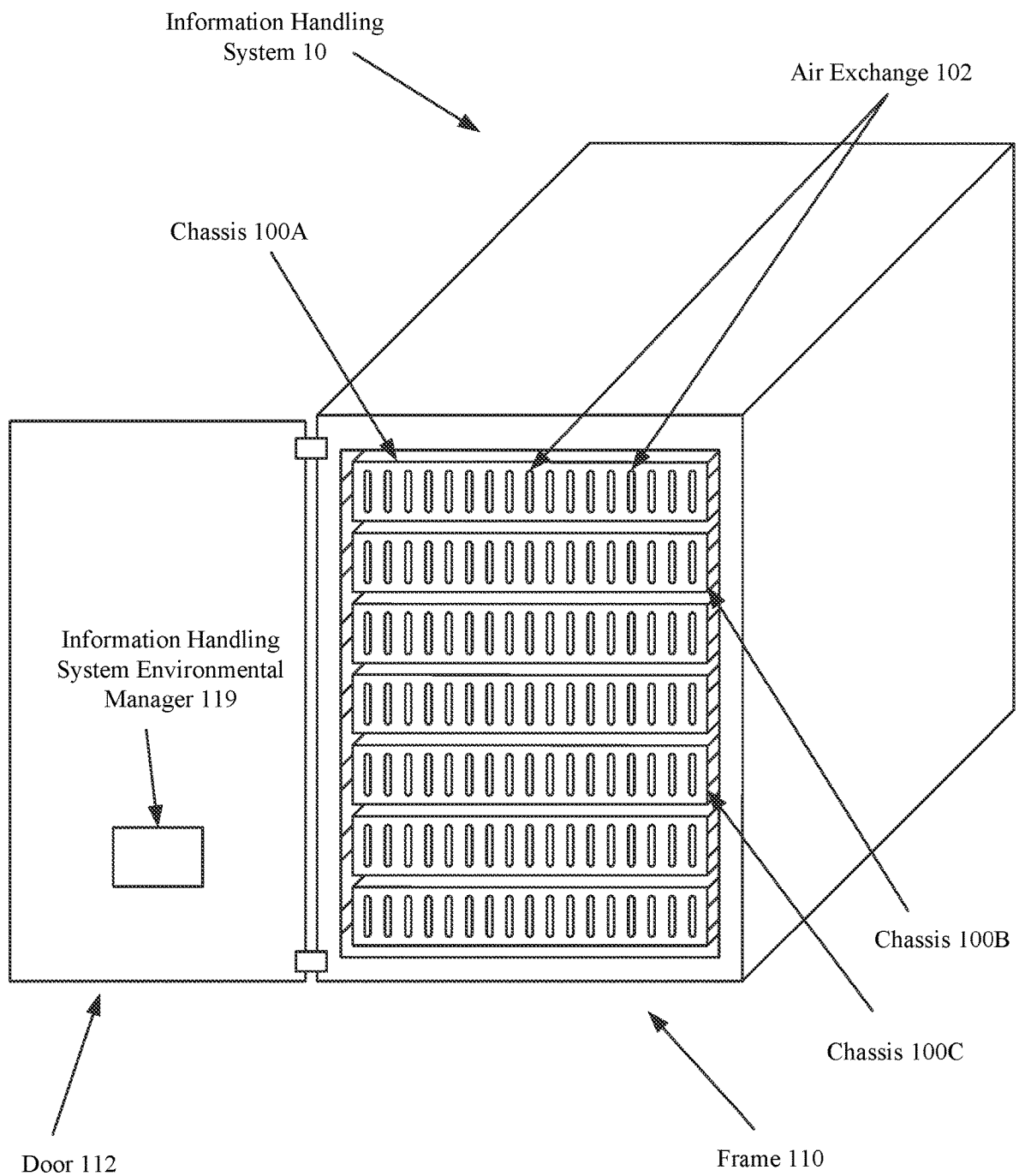
FIG. 1.1

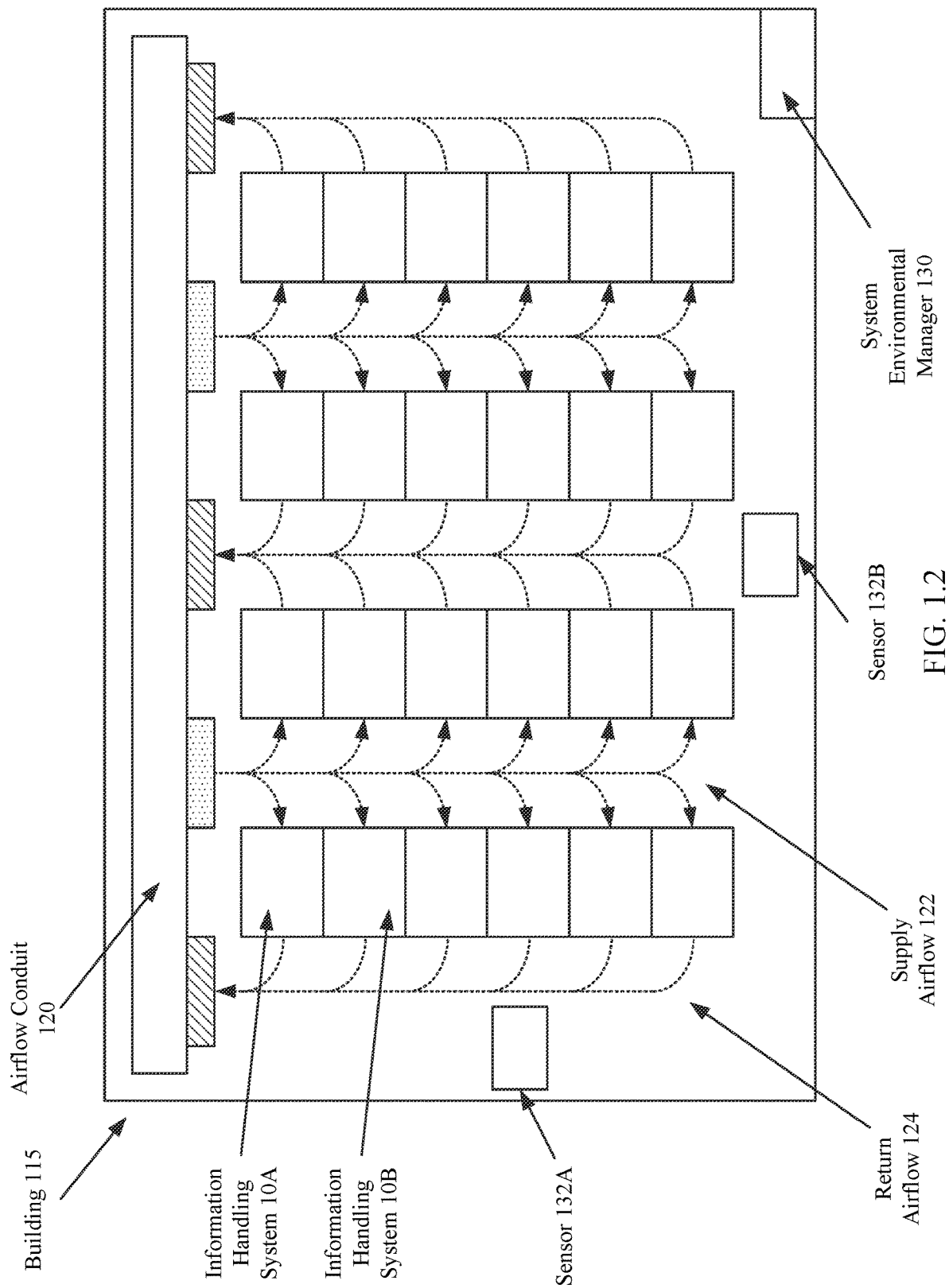
FIG. 1.2

SYSTEM AND METHOD FOR ADJUSTING ENVIRONMENTAL CONDITIONS

BACKGROUND

As the value and use of information continues to increase, individuals and businesses seek additional ways to process and store information. One option available to users is information handling systems. An information handling system (IHS) generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Use cases for information handling systems are causing progressively larger number of information handling systems to be disposed near each other. For example, rack mount systems utilize a rack structure to stack two or more chassis in an information handling system. Due to the changing uses of information handling systems, chassis therein may be modular allowing for continual partial upgrades to the information handling system. That is, an information handling system may be composed of multiple chassis that may be attached to each other to form the information handling systems. When the multiple chassis are attached, components of the information handling system disposed in each of the chassis may become operably connected to each other.

SUMMARY

In general, in one aspect, a method for removing moisture from an airflow via a cooling system in accordance with one or more embodiments of the invention includes identifying a plurality of active cooling circuits for an information handling system. The method also includes lowering a first temperature set point of a first cooling circuit of the multiple cooling circuits. In addition, the method includes raising a second temperature set point of a second cooling circuit of the multiple cooling circuits.

In general, in one aspect, a cooling system in accordance with one or more embodiments of the invention includes a plurality of cooling circuits in a parallel configuration. The cooling system also includes a processor programmed to lower a first temperature set point of a first cooling circuit of the multiple cooling circuits, and raise a second temperature set point of a second cooling circuit of the multiple cooling circuits.

In general, in one aspect, a non-transitory computer readable medium includes computer readable program code, which when executed by a computer processor enables the computer processor to perform a method for managing environmental conditions, the method in accordance with one or more embodiments of the invention includes identifying a plurality of active cooling circuits in a parallel configuration, lowering a first temperature set point of a first cooling circuit of the multiple cooling circuits; and raising a second temperature set point of a second cooling circuit of the multiple cooling circuits.

Other aspects of the invention will be apparent from the following description and the appended claims.

BRIEF DESCRIPTION OF DRAWINGS

FIG. 1.1 shows a diagram of an information handling system in accordance with one or more embodiments of the invention.

FIG. 1.2 shows a diagram of a building that includes information handling systems in accordance with one or more embodiments of the invention.

DETAILED DESCRIPTION

Figure 2:
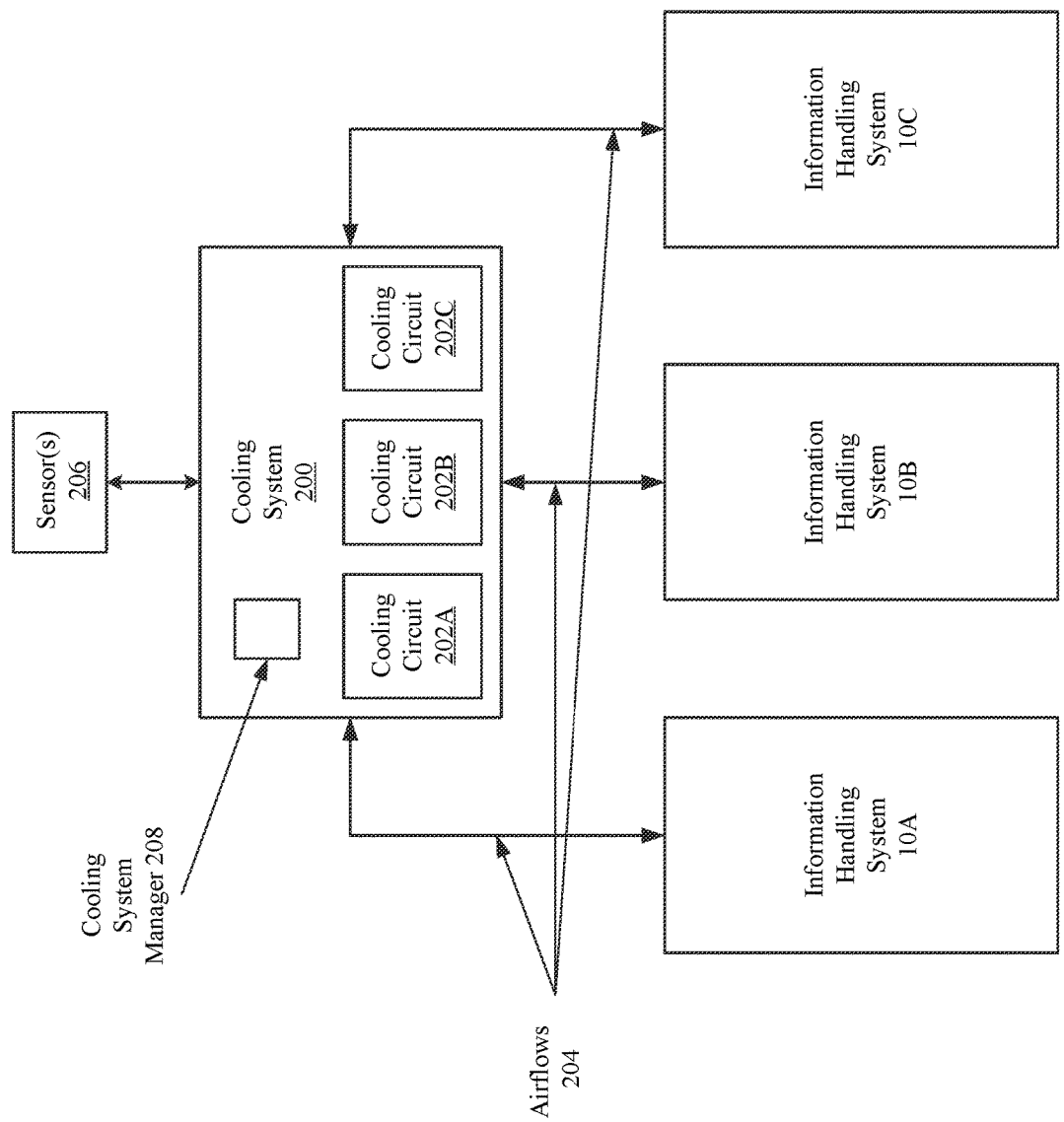
FIG. 2 shows a diagram of a cooling system for an information handling system in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to systems, devices, and methods for managing components of an information handling system. An information handling system may be a system that provides computer implemented services. These services may include, for example, database services, electronic communication services, data storage services, etc.

To provide these services, the information handling system may include one or more computing devices. The computing devices may include any number of computing components that facilitate providing of the services of the information handling system. The computing components may include, for example, processors, memory modules, circuit cards that interconnect these components, etc.

During operation, these components may generate heat and require gas flows to maintain the temperatures of these components within nominal ranges. However, these gases may include moisture that may cause components to degrade. The degradation may cause corrosion and/or damage to the components. The damage may cause the components to fail and/or cause information handling system utilizing the components to fail.

Embodiments of the invention may provide methods and systems that manage environmental conditions. To manage environmental conditions, a system may reduce the rates at which degradation occurs to prevent premature failures of components due to degradation.

To reduce the rates of degradation, embodiments of the invention may reduce moisture present in gases used for thermal management of components. The moisture removal may include cooling a coil over which the gases pass to condense moisture into a liquid form, thereby pulling the moisture out of the gas. For example, gases used to reduce the temperature of the components as part of thermal management of the components may be cooled before being used for thermal management of the components. Consequently, the relative humidity level of the gases may be reduced which, in turn, may reduce the rates of degradation of the components caused by the gases.

By doing so, a system, in accordance with embodiments of the invention, may be less likely to prematurely fail or otherwise enter an undesirable degradation state, be able to accept a wider range of gas compositions (e.g., that include levels of humidity and are at temperatures that would lead to high rates of degradation) that may be more likely to cause degradation without negatively impacting the system, and/or may be less costly to operate by reducing the necessary level of conditioning of gases taken into chassis of information handling systems for thermal management purposes by utilizing cooling circuits to remove moisture from the gases.

The following describes various embodiments of the invention.

FIG. 1.1 shows an information handling system (10) in accordance with one or more embodiments of the invention. The system may include a frame (110) and any number of chassis (e.g., 100A, 100B, 100C).

The frame (110) may be a mechanical structure that enables chassis to be positioned with respect to one another. For example, the frame (110) may be a rack mount enclosure that enables chassis to be disposed within it. The frame (110) may be implemented as other types of structures adapted to house, position, orient, and/or otherwise physically, mechanically, electrically, and/or thermally manage chassis (e.g., direct airflows to the chassis). By managing the chassis, the frame (110) may enable multiple chassis to be densely packed in space without negatively impacting the operation of the information handling system (10). Further, the frame may include a door (112) to selectively provide access to the information handling system (10).

A chassis (e.g., 100A) may be a mechanical structure for housing components of an information handling system. For example, a chassis may be implemented as a rack mountable enclosure for housing components of an information handling system. The chassis may be adapted to be disposed within the frame (110) and/or utilize services provided by the frame (110) and/or other devices.

Any number of components may be disposed in each of the respective chassis (e.g., 100A, 100B, 100C). These components may be portions of computing devices that provide computer implemented services, discussed in greater detail below.

When the components provide computer implemented services, the components may generate heat. For example, the components may utilize electrical energy to perform computations and generate heat as a byproduct of performing the computations. If left unchecked, a buildup of heat within a chassis may cause temperatures of the components disposed within the chassis to exceed preferred ranges.

The preferred ranges may include a nominal range in which the components respectively operate: (i) without detriment and/or (ii) are likely to be able to continue to operate through a predetermined service life of a component. Consequently, it may be desirable to maintain the temperatures and/or humidity of the respective components within the preferred range (e.g., a nominal range).

As described in further detail below, cooling systems (see e.g., FIG. 2) are utilized to set and maintain a temperature set point within the preferred range. The cooling system includes cooling circuits that are utilized to maintain the temperature set point. The cooling circuits may cause a refrigerant to be sufficiently cold as to cause moisture in the gases exchanging heat with the refrigerant (e.g., by passing the gas over coils through which the refrigerant flows) to condense into a liquid state and out of the gas, thereby reducing the humidity of the air. In this manner, a cooling system may be utilized to both cool gases and reduce the humidity of gases. The cooling systems may be: (i) located externally to the IHS (10 in FIG. 1.1) and/or the building (115 in FIG. 1.2) or (ii) located in within the building (115 in FIG. 1.2). The cooling systems may be present in other locations without departing from the invention.

To operate components within the preferred range of temperature, the chassis may include air exchanges (e.g., 102). An air exchange may be one or more openings in an exterior of a chassis that enables the chassis to exchange gases with an ambient environment. For example, a chassis may utilize air exchanges to (i) vent hot gases and (ii) intake cool gases. By doing so, the temperature of the gases within the chassis may be reduced. Consequently, the temperatures of components within the chassis may be reduced by utilizing the cooler gases taken into the chassis via an air exchange.

In one or more embodiments of the invention, managing the operation of the cooling circuits may be handled by an information handling system environmental manager (119) that may be a computing device programmed to (i) determine that humidity is above a threshold, (ii) identify active cooling circuits in a cooling system, (iii) adjust a first cooling circuit to a lower temperature set point, and (iv) adjust a second cooling circuit to a higher temperature set point. In doing so, the information handling system environmental manager (119) may maintain a temperature set point for the information handling system (10) while also reducing the humidity experienced by the information handling system (10).

To decide which action to perform, the information handling system environmental manager (119) may obtain and/or be provided information regarding the environmental conditions (e.g., temperatures) within each of the chassis. For example, the system information system environmental manager (119) may be operably connected to environmental managers of each of the chassis via any combination of wired and/or wireless networks.

In one or more embodiments of the invention, the information handling system environmental manager (119) is implemented using computing devices. The computing devices may be, for example, mobile phones, tablet computers, laptop computers, desktop computers, servers, distributed computing systems, embedded computing devices, or a cloud resource. The computing devices may include one or more processors, memory (e.g., random access memory), and persistent storage (e.g., disk drives, solid state drives, etc.). The persistent storage may store computer instructions, e.g., computer code, that (when executed by the processor(s) of the computing device) cause the computing device to provide the functionality of the information handling system environmental manager (119) described through this application and all, or a portion, of the method illustrated in FIG. 3. The information handling system environmental manager (119) may be implemented using other types of computing devices without departing from the invention. For additional details regarding computing devices, refer to FIG. 4.

In one or more embodiments of the invention, the information handling system environmental manager (119) may be implemented using a hardware device including circuitry. The information handling system environmental manager (119) may be implemented using, for example, a digital signal processor, a field programmable gate array, or an application specific integrated circuit. The information handling system environmental manager (119) may be implemented using other types of hardware devices without departing from the invention.

In one or more embodiments of the invention, the information handling system environmental manager (119) is implemented using computing code stored on a persistent storage that when executed by a processor performs all, or a portion, of the functionality of the information handling system environmental manager (119). The processor may be a hardware processor including circuitry such as, for example, a central processing unit or a microcontroller. The processor may be other types of hardware devices for processing digital information without departing from the invention.

In one or more embodiments of the invention, the information handling system environmental manager (119) is implemented using distributed computing devices. As used herein, a distributed computing device refers to functionality provided by a logical device that utilizes the computing resources of one or more separate and/or distinct computing devices. For example, in one or more embodiments of the invention, the information handling system environmental manager (119) is implemented using distributed devices that include components distributed across any number of separate and/or distinct computing devices. In such a scenario, the functionality of the information handling system environmental manager (119) may be performed by multiple, different computing devices without departing from the invention.

To further clarify the environments in which cooling systems (not shown) may be utilized, a diagram of an environment in which chassis of IHSs may reside is illustrated in FIG. 1.2.

Turning to FIG. 1.2, FIG. 1.2 shows a top view diagram of a building (115) in which chassis of IHSs may reside in accordance with one or more embodiments of the invention. The building (115) may house a data center (e.g., an aggregation of information handling systems) that includes any number of information handling systems (e.g., 10A, 10B). The information handling systems may include chassis, which may need to take in and exhaust gases for temperature regulation purposes due to heat generation by components disposed in the chassis.

To facilitate gas management within the building (115), the information handling systems may be organized into rows (or other groupings of information handling systems). In FIG. 1.2, the rows of information handling systems extend from top to bottom along the page. To enable gases to be provided to the information handling systems (e.g., for temperature regulation purposes), an airflow conditioner (120) may be disposed within the building. The airflow conditioner (120) may provide supply airflow (122) and take in a return airflow (124). These airflows are illustrated as arrows having dashed tails.

The supply airflow (122) may be at a lower temperature than the return airflow (124). Consequently, when information handling systems obtain portions of the supply airflow (122), the information handling systems may be able to utilize the supply airflow (122) to cool components disposed within the chassis of the information handling systems. For example, gases from the supply airflow (122) may be passed by components disposed within chassis of information handling systems that are at elevated temperatures. The gases may be at a lower temperature than the components. Consequently, thermal exchange between the gases and the components may decrease the temperature of the components.

After utilizing the gases from the supply airflow (122), the information handling systems may exhaust the gases as the return airflow (124). After being exhausted from the information handling systems, the return airflow (124) may be obtained by the airflow conditioner (120), cooled, and recirculated as the supply airflow (122).

In addition to cooling the return airflow (124), the airflow conditioner (120) may be capable of obtaining gases from other areas (e.g., outside of the building), reducing the humidity level of an airflow, and/or otherwise conditioning gases for use by information handling systems and/or other devices.

To manage the aforementioned process, a system environmental manager (130) may be disposed within the building (115) or at other locations. The system environmental manager (130) may be a computing device programmed to (i) obtain information regarding the operation of the information handling systems and (ii) set the operating points of the airflow conditioner (120). By doing so, the system environmental manager (130) may cause the airflow conditioner (120) to provide gases to the information handling systems having a temperature and/or humidity level that may better enable the information handling systems to regulate their respective environmental conditions within the chassis of the respective information handling systems. However, conditioning the supply airflow (122) may utilize large amounts of energy.

The airflow conditioner (120) may include functionality to granularly, or at a macro level, modify the temperature and/or humidity level of the supply airflow (122). Consequently, different information handling systems (or groups thereof) may receive different supply airflows (e.g., 122) having different characteristics (e.g., different temperatures and/or humidity levels, different sources, etc.). For example, as discussed in greater detail below, the airflow conditioner (120) may be part of a cooling system that includes multiple cooling circuits. Each cooling circuit includes one or more compressors that may be variably operated. The compressors cause a refrigerant to become cooler. The cooled refrigerant then passes through one or more coils. The air flowing through the airflow condition (120) then passes over the coils to exchange heat with the cooled refrigerant, thereby causing the air to be cooled. During this process of heat exchanging, moisture in the air may condense into a liquid on the coil, thereby reducing the humidity of the air (e.g., the supply airflow (122)). As will be discussed below, a temperature set point of one cooling circuit may be lowered to cause more moisture to fall out of the air while a temperature set point of a second cooling circuit may be raised. Thus, embodiments of the invention discussed below provide for a system and method reduce the humidity while maintaining a temperature set point.

Conditioning the return airflow (124) or gases obtained from outside of the building (115) may be costly, consume large amounts of electricity, or may otherwise be undesirable. To reduce these costs, the system environmental manager (130) may set the operating point (e.g., desired temperature/humidity levels of different portions of the supply airflow (122)) of the airflow conditioner (120) to only provide the minimum necessary characteristics required by each of the IHSs so that it meets is service life goals. By doing so, the cost of providing the supply airflow (122) having characteristics required to meet the environmental requirements of the chassis of the information handling systems may be reduced.

To decide how to set the operating points of the airflow conditioner (120), the system environmental manager (130) may obtain and/or be provided information regarding the environmental conditions (e.g., temperatures and/or relative humidity levels) within each of the chassis. For example, the system environmental manager (130) may be operably connected to environmental managers of each of the chassis and/or the airflow conditioner (120) via any combination of wired and/or wireless networks. The respective environmental managers of the chassis may provide such information to the system environmental manager (130) and/or service requests regarding the operating points of the airflow conditioner (120) via the operable connections.

In addition to, or as an alternative to the above, the system environmental manager (130) may obtain and/or be provided information regarding the environmental conditions (e.g., temperatures and/or relative humidity levels) via any number of sensors (e.g., 132A, 132B) positioned at one or more locations in the building (115). For example, the system environmental manager (130) may be operably connected to sensors (132) via any combination of wired and/or wireless networks. Further, the system environmental manager (130) may obtain and/or be provided information regarding the environmental conditions (e.g., temperatures, relative humidity levels) via sources outside the building (115) and/or control of the system environmental manager (130) that provides environmental conditions for an area at or near the building (115) (e.g., weather data).

In one or more embodiments of the invention, the system environmental manager (130) is implemented using computing devices. The computing devices may be, for example, mobile phones, tablet computers, laptop computers, desktop computers, servers, distributed computing systems, embedded computing devices, or a cloud resource. The computing devices may include one or more processors, memory (e.g., random access memory), and persistent storage (e.g., disk drives, solid state drives, etc.). The persistent storage may store computer instructions, e.g., computer code, that (when executed by the processor(s) of the computing device) cause the computing device to provide the functionality of the system environmental manager (130) described through this application and all, or a portion, of the method illustrated in FIG. 3. The system environmental manager (130) may be implemented using other types of computing devices without departing from the invention. For additional details regarding computing devices, refer to FIG. 4.

In one or more embodiments of the invention, the system environmental manager (130) may be implemented using a hardware device including circuitry. The system environmental manager (130) may be implemented using, for example, a digital signal processor, a field programmable gate array, or an application specific integrated circuit. The system environmental manager (130) may be implemented using other types of hardware devices without departing from the invention.

In one or more embodiments of the invention, the system environmental manager (130) is implemented using computing code stored on a persistent storage that when executed by a processor performs all, or a portion, of the functionality of the system environmental manager (130). The processor may be a hardware processor including circuitry such as, for example, a central processing unit or a microcontroller. The processor may be other types of hardware devices for processing digital information without departing from the invention.

In one or more embodiments of the invention, the system environmental manager (130) is implemented using distributed computing devices. As used herein, a distributed computing device refers to functionality provided by a logical device that utilizes the computing resources of one or more separate and/or distinct computing devices. For example, in one or more embodiments of the invention, the system environmental manager (130) is implemented using distributed devices that include components distributed across any number of separate and/or distinct computing devices. In such a scenario, the functionality of the system environmental manager (130) may be performed by multiple, different computing devices without departing from the invention.

FIG. 2 shows a diagram of a cooling system (200) in accordance with one or more embodiments of the invention. As discussed above, the cooling system (200) provides cooling to the IHSs (e.g., 10A, 10B, and 10C) via airflows (204), which may be the same supply airflow (122) and/or the return airflow (124) in FIG. 1.2. Cool air supplied by the cooling system (200) passes over components within the IHSs, thereby reducing their temperatures. The now heated air is then returned to the cooling system where the heated air passes through one or more of the cooling circuits (e.g., 202A, 202B, and/or 202C) to remove heat from the air and return the air to the IHSs for additional cooling.

In one or more embodiments of the invention, each cooling circuit (e.g., 202A, 202B, and/or 202C) may operate in conjunction with (i.e., in parallel or in series) another cooling circuit or independently from other cooling circuits. Air passing through the cooling circuits may recombine and mix after being cooled and prior to exiting the cooling system (200). Further, each cooling circuit may contain all of the necessary components for removing heat from an airflow and providing cooled air to the IHSs. For example, each cooling circuit may include one or more compressors, each of which may be operated independently.

In one or more embodiments of the invention, the cooling system (200) may include a cooling system manager (208) that controls the operations of the cooling system (200). For example, the cooling system manager (208) may provide a temperature and humidity set point that the cooling system (200) maintains. The cooling system (200) includes one or more sensors (206) that measure a temperature and/or humidity at some location. For example, the sensors (206)

may be the sensors (132A and/or 132B) in FIG. 1.2, sensors within one of the IHSs, or sensors positioned at any other suitable location. The cooling system manager (208) compares the temperature and humidity data from the sensors (206) to the temperature and humidity set points and determines whether a change in the operation of the cooling system (200) should be performed to maintain the temperature and humidity set points.

Further, the cooling system manager (208) may adjust the operation of each cooling circuit individually. For example, each cooling circuit may be provided a temperature set point in addition to a temperature set point being provided for the cooling system as a whole. As such, one portion of the cooling system (200) may be colder than another portion. However, the output of the cooling system may be unchanged. By doing so, the cooling system (200) may be utilized to remove moisture from the air, thereby reducing humidity while also maintaining a temperature set point.

In one or more embodiments of the invention, the cooling system manager (208) is implemented using computing devices. The computing devices may be, for example, mobile phones, tablet computers, laptop computers, desktop computers, servers, distributed computing systems, embedded computing devices, or a cloud resource. The computing devices may include one or more processors, memory (e.g., random access memory), and persistent storage (e.g., disk drives, solid state drives, etc.). The persistent storage may store computer instructions, e.g., computer code, that (when executed by the processor(s) of the computing device) cause the computing device to provide the functionality of the cooling system manager (208) described through this application and all, or a portion, of the method illustrated in FIG. 3. The cooling system manager (208) may be implemented using other types of computing devices without departing from the invention. For additional details regarding computing devices, refer to FIG. 4.

In one or more embodiments of the invention, the cooling system manager (208) may be implemented using a hardware device including circuitry. The cooling system manager (208) may be implemented using, for example, a digital signal processor, a field programmable gate array, or an application specific integrated circuit. The cooling system manager (208) may be implemented using other types of hardware devices without departing from the invention.

In one or more embodiments of the invention, the cooling system manager (208) is implemented using computing code stored on a persistent storage that when executed by a processor performs all, or a portion, of the functionality of the cooling system manager (208). The processor may be a hardware processor including circuitry such as, for example, a central processing unit or a microcontroller. The processor may be other types of hardware devices for processing digital information without departing from the invention.

In one or more embodiments of the invention, the cooling system manager (208) is implemented using distributed computing devices. As used herein, a distributed computing device refers to functionality provided by a logical device that utilizes the computing resources of one or more separate and/or distinct computing devices. For example, in one or more embodiments of the invention, the cooling system manager (208) is implemented using distributed devices that include components distributed across any number of separate and/or distinct computing devices. In such a scenario, the functionality of the cooling system manager (208) may be performed by multiple, different computing devices without departing from the invention.

Figure 3:
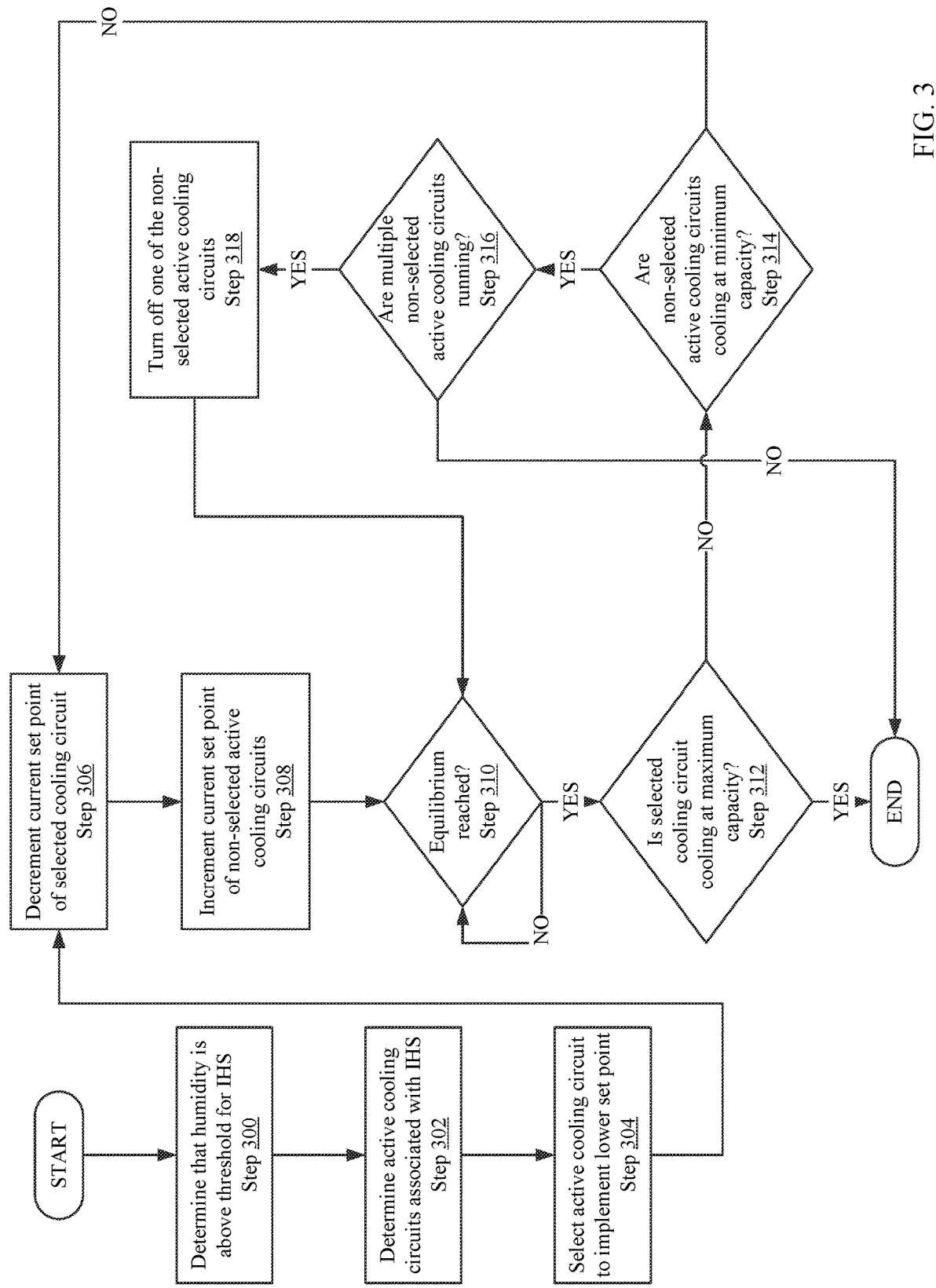
FIG. 3 shows a flowchart of a method of managing environmental conditions in accordance with one or more embodiments of the invention.

FIG. 3 shows a flowchart of a method in accordance with one or more embodiments of the invention. The method depicted in FIG. 3 may be used to manage a chassis environment in accordance with one or more embodiments of the invention. The method shown in FIG. 3 may be performed by, for example, a cooling system manager (e.g., 208, FIG. 2). Further, cooling circuits discussed in relation to the method depicted in FIG. 3 may include the cooling circuits (e.g., 202A, 202B, 202C) of FIG. 2. Other components of the system illustrated in FIGS. 1.1-3 may perform all, or a portion, of the method of FIG. 3 without departing from the invention.

While FIG. 3 is illustrated as a series of steps, any of the steps may be omitted, performed in a different order, additional steps may be included, and/or any or all of the steps may be performed in a parallel and/or partially overlapping manner without departing from the invention.

In step 300, it is determined that a humidity is above a threshold for an associated IHS. As discussed above, there may be one or more sensors disposed at various locations and the sensors may provide data indicative of the relative humidity experienced by the associated IHS. A relative humidity threshold may be set (e.g., by a user) and may be based on component specifications and/or industry guidelines (e.g., American Society of Heating, Refrigerating and Air-Conditioning Engineers). The method may compare the relative humidity data provided by sensors with the humidity threshold in determining that the humidity is above a threshold.

In step 302, active cooling circuits associated with the IHS are identified. Cooling circuits that are currently running and providing cooling may have their operations adjusted and thus are identified. Cooling circuits that are not operating may be engaged at a later time and may also be identified in step 302 as non-currently running cooling circuits.

In step 304, an active cooling circuit is selected to implement a lower set temperature set point from the active cooling circuits identified in step 302. The cooling circuit that is selected may be based on a number of compressors included in the cooling circuit, an amount of time of the cooling circuit has been running, a cooling capacity of the cooling circuit, an order of the cooling circuits, a configuration of the cooling circuit (i.e., a parallel configuration with other cooling circuits and/or a series configuration with other cooling circuits), and/or a random selection. Other methods for selecting the active cooling circuit may be used without departing from the invention.

In addition, the set point may be a temperature set point, an operating speed of the compressor, a percentage of the total capacity of the compressor, or any other set point that adjust the operation of the cooling circuit.

In step 306, the current set point of the identified cooling circuit is decremented. Decrementing the set point of the identified cooling circuit causes the cooling provided by the cooling circuit to increase. In particular, the refrigerant passing through the cooling circuit and into a cooling coil is lowered in temperature such that the air passing over the coil containing the refrigerant is also lowered in temperature. In some embodiments, this may cause the set point to increase (e.g., to cause an increase in cooling, an operating speed of the components within the cooling circuit may increase). Further, the amount that the set point is decremented may be based on a current set point of the cooling circuit, a user-defined setting, or any other suitable basis.

Lowering the temperature of the air passing over a cooling coil increases the amount of moisture in the air that is condensed into a liquid onto the cooling coil, thereby reducing the humidity of the air. Thus, by decrementing the set point of the identified cooling circuit, the humidity of the air may be reduced without the addition of any extra equipment, thereby reducing the cost and complexity of the air conditioning In step 308, a current set point of the non-selected active cooling circuits is incremented. Incrementing the set point of the non-selected cooling circuits causes the cooling provided by these cooling circuits to decrease. In particular, the refrigerant passing through these cooling circuits and into a cooling coil is raised in temperature such that the air passing over the coil containing the refrigerant is also raised in temperature as compared to before incrementing the set point. It should be appreciated that air passing over the coil is still experiencing cooling, just not as much as before the set point is incremented. In some embodiments, this may cause the set point to decrease (e.g., to cause a decrease in cooling, an operating speed of the components within the cooling circuit may decrease). Further, the amount that the set point is incremented may be based on the amount the set point of the selected cooling circuit is decremented, a current set point of the cooling circuit, a user-defined setting, or any other suitable basis.

In step 310, it is determined whether an equilibrium is reached. By decrementing the set point in step 306 and incrementing the set point in step 308, the overall temperature set point of the cooling system remains unchanged (even though the set points of the individual cooling circuits have been modified). Said another way, the temperature of the fluid leaving the cooling system remains unchanged, even though the set points of the active cooling circuits have changed.

Continuing with the discussion of FIG. 3, changing the temperature set points in steps 306 and 308 causes the temperature to waver for a period of time. As such, in step 310, a determination is made about whether temperature equilibrium is reached. If an equilibrium has not yet been reached, the cooling system manager continues to wait until an equilibrium is reached. After it is determined that an equilibrium is reached, the method continues to step 312.

In step 312, it is determined if the selected cooling circuit is cooling at its maximum capacity. If the selected cooling circuit is cooling at maximum capacity, then the selected cooling circuit cannot provide any additional cooling and the method ends. If it is determined that the selected cooling circuit is not cooling at maximum, then the method proceeds to step 314.

In step 314, it is determined whether the non-selected cooling circuits are cooling at a minimum capacity. If it is determined that the non-selected cooling circuits are not at a minimum capacity, then the method proceeds to back to step 306. In this manner, the method enables the temperature set points of the cooling circuits within the cooling system to widen as much as possible, while maintaining the same temperature set point for the cooling system as a whole. Further, widening the set points enhances the dehumidification provided by the method. If it is determined that the non-selected cooling circuits are at a minimum capacity, then the method proceeds to step 316.

In step 316, it is determined whether multiple non-selected cooling circuits are running. If it is determined that there are not multiple non-selected cooling circuits running, then the method may end because the temperature set points of the cooling circuits cannot be widened any further. If multiple non-selected cooling circuits are running, then the cooling provided by the multiple non-selected cooling circuits may be further reduced and the method proceeds to step 318.

In step 318, one of the multiple non-selected cooling circuits is turned off. By turning off one of the running cooling circuits, some cooling capacity is lost. Thus, the method then returns to step 310 to again wait for an equilibrium to be reached.

By utilizing the method a temperature set point for a cooling system may remain the same while also increasing the rate at which the cooling system may remove moisture from the air, thus lowering the relative humidity. In addition, the provided method reduces costs of air conditioning systems by using fewer pieces of equipment to reduce the relative humidity of the air. Further, utilizing fewer pieces of equipment may increase the reliability of the cooling system.

Figure 4:
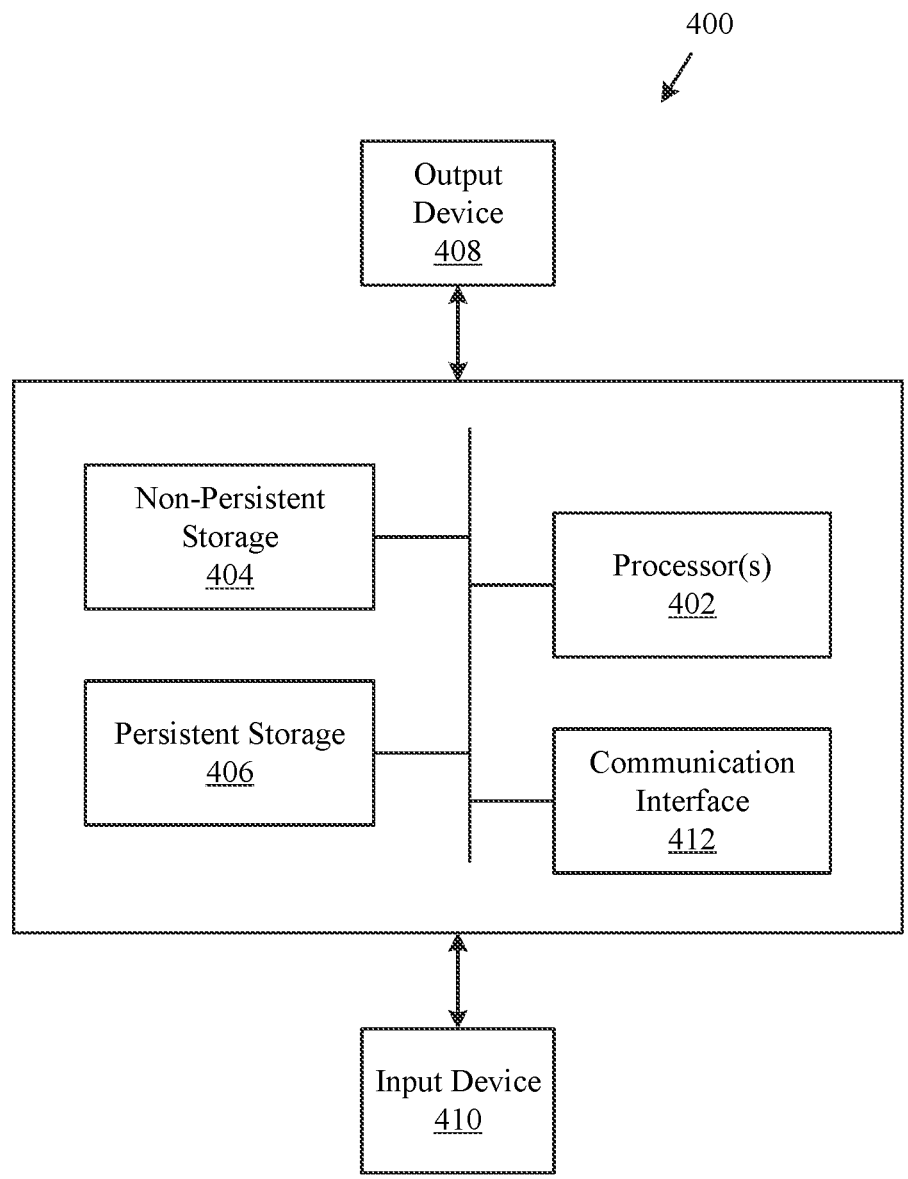
FIG. 4 shows a diagram of a computing device in accordance with one or more embodiments of the invention.

Embodiments of the invention may be implemented using a computing device. FIG. 4 shows a diagram of a computing device in accordance with one or more embodiments of the invention. The computing device (400) may include one or more computer processors (402), non-persistent storage (404) (e.g., volatile memory, such as random access memory (RAM), cache memory), persistent storage (406) (e.g., a hard disk, an optical drive such as a compact disk (CD) drive or digital versatile disk (DVD) drive, a flash memory, etc.), a communication interface (412) (e.g., Bluetooth interface, infrared interface, network interface, optical interface, etc.), input devices (410), output devices (408), and numerous other elements (not shown) and functionalities. Each of these components is described below.

In one embodiment of the invention, the computer processor(s) (402) may be an integrated circuit for processing instructions. For example, the computer processor(s) may be one or more cores or micro-cores of a processor. The computing device (400) may also include one or more input devices (410), such as a touchscreen, keyboard, mouse, microphone, touchpad, electronic pen, or any other type of input device. Further, the communication interface (412) may include an integrated circuit for connecting the computing device (400) to a network (not shown) (e.g., a local area network (LAN), a wide area network (WAN) such as the Internet, mobile network, or any other type of network) and/or to another device, such as another computing device.

In one embodiment of the invention, the computing device (400) may include one or more output devices (408), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (402), non-persistent storage (404), and persistent storage (406). Many different types of computing devices exist, and the aforementioned input and output device(s) may take other forms.

Embodiments of the invention may provide an improved method for managing an environment of an information handling system. Specifically, embodiments of the invention may provide a method and device for managing humidity that may cause components of an information handling system to fail. To do so, embodiments of the invention may provide a system and/or method that includes using cooling circuits in a cooling system to remove moisture from the air and reduce humidity. By doing so, the environmental conditions experienced by components in an information handling system may remain within a specified range using less power and/or air conditioning equipment.

Thus, embodiments of the invention may address the problem of providing suitable environmental conditions for components in an information handling system. Specifically, embodiments of the invention may provide a method of managing humidity that enables less power to be consumed for environmental conditioning purposes.

The problems discussed above should be understood as being examples of problems solved by embodiments of the invention disclosed herein and the invention should not be limited to solving the same/similar problems. The disclosed invention is broadly applicable to address a range of problems beyond those discussed herein.

One or more embodiments of the invention may be implemented using instructions executed by one or more processors of the computing device (400). Further, such instructions may correspond to computer readable instructions that are stored on one or more non-transitory computer readable mediums.

While the invention has been described above with respect to a limited number of embodiments, those skilled in the art, having the benefit of this disclosure, will appreciate that other embodiments may be devised which do not depart from the scope of the invention as disclosed herein. Accordingly, the scope of the invention should be limited only by the attached claims.

What is claimed is:

1. A method for removing moisture from an airflow via a cooling system, the method comprising:
   identifying a plurality of active cooling circuits for an information handling system;
   lowering a first temperature set point of a first cooling circuit of the plurality of cooling circuits, wherein lowering the first temperature set point causes a temperature of a first refrigerant passing through the first cooling circuit to decrease; and
   raising a second temperature set point of a second cooling circuit of the plurality of cooling circuits,
      wherein raising the second temperature set point causes a temperature of a second refrigerant passing through the second cooling circuit to increase, and
      wherein an output air temperature of the cooling system is unchanged by the raising and lowering.

2. The method of claim 1, further comprising:
   determining that the first cooling circuit is not at a maximum output following the lowering of the first temperature set point; and
   further lowering the first temperature set point in response to determining that the first cooling circuit is not at a maximum output.

3. The method of claim 2, further comprising:
   determining that the second cooling circuit is not at a minimum output following the raising of the second temperature set point; and
   further raising the second temperature set point in response to determining that the second cooling circuit is not at a minimum output.

4. The method of claim 1, further comprising:
   raising a third temperature set point of a third cooling circuit of the plurality of cooling circuits.

5. The method of claim 4, further comprising:
   determining that one of the second cooling circuit and third cooling circuit is at a minimum output; and
   based on the determination, turning off one of the second cooling circuit and third cooling circuit.

6. The method of claim 5, further comprising:
   further lowering the first temperature set point in response to shutting off one of the second cooling circuit and the third cooling circuit.

7. The method of claim 1, wherein the plurality of cooling circuits are in a parallel configuration.

8. A cooling system for a building comprising a plurality of information handling systems, comprising:
   a plurality of cooling circuits in a parallel configuration; and
   a processor programmed to:
      lower a first temperature set point of a first cooling circuit of the plurality of cooling circuits, wherein lowering the first temperature set point causes a temperature of a first refrigerant passing through the first cooling circuit to decrease; and
      raise a second temperature set point of a second cooling circuit of the plurality of cooling circuits,
         wherein raising the second temperature set point causes a temperature of a second refrigerant passing through the second cooling circuit to increase, and
         wherein an output air temperature of the cooling system is unchanged by the raising and lowering.

9. The cooling system of claim 8, wherein the processor is further programmed to:
   determine that the first cooling circuit is not at a maximum output following the lowering of the first temperature set point; and
   further lower the first temperature set point in response to determining that the first cooling circuit is not at a maximum output.

10. The cooling system of claim 9, wherein the processor is further programmed to:
   determine that the second cooling circuit is not at a minimum output following the raising of the second temperature set point; and
   further raise the second temperature set point in response to determining that the second cooling circuit is not at a minimum output.

11. The cooling system of claim 8, wherein the processor is further programmed to:
   raising a third temperature set point of a third cooling circuit of the plurality of cooling circuits.

12. The cooling system of claim 11, wherein the processor is further programmed to:
   determine that one of the second cooling circuit and third cooling circuit is at a minimum output; and
   based on the determination, shut off one of the second cooling circuit and third cooling circuit.

13. The cooling system of claim 12, wherein the processor is further programmed to:
   further lower the first temperature set point in response to shutting off one of the cooling circuit compressor and the third cooling circuit.

14. A non-transitory computer readable medium comprising computer readable program code, which when executed by a computer processor enables the computer processor to perform a method for managing environmental conditions, the method comprising:
   identifying a plurality of active cooling circuits in a parallel configuration in a cooling system;
   lowering a first temperature set point of a first cooling circuit of the plurality of cooling circuits, wherein lowering the first temperature set point causes a temperature of a first refrigerant passing through the first cooling circuit to decrease; and raising a second temperature set point of a second cooling circuit of the plurality of cooling circuits,
  wherein raising the second temperature set point causes a temperature of a second refrigerant passing through the second cooling circuit to increase, and
  wherein an output air temperature of the cooling system is unchanged by the raising and lowering.

15. The non-transitory computer readable medium of claim 14, the method further comprising:
  determining that the first cooling circuit is not at a maximum output following the lowering of the first temperature set point;
  determining that the second cooling circuit is not at a minimum output following the raising of the second temperature set point;
  in response to determining that the first cooling circuit is not at a maximum output and determining that the second cooling circuit is not at a minimum output:
    further lowering the first temperature set point; and
    further raising the second temperature set point.

16. The non-transitory computer readable medium of claim 14, wherein the method further comprises:
  raising a third temperature set point of a third cooling circuit of the plurality of cooling circuits;
  determining that one of the second cooling circuit and third cooling circuit is at a minimum output; and
  shutting off one of the second cooling circuit and third cooling circuit in response to determining that one of the second cooling circuit and third cooling circuit is at the minimum output.

17. The non-transitory computer readable medium of claim 16, wherein the method further comprises:
  further lowering the first temperature set point in response to shutting off one of the second cooling circuit and the third cooling circuit.

* * * * *